(12) United States Patent
Peng et al.

(10) Patent No.: US 7,148,075 B2
(45) Date of Patent: Dec. 12, 2006

(54) VERTICAL SEMICONDUCTOR DEVICES OR CHIPS AND METHOD OF MASS PRODUCTION OF THE SAME

(76) Inventors: Hui Peng, 35964 Vivian Pl., Fremont, CA (US) 94536; Wei Luo, #5 Jing Tu Lane, Dong Cheng District, Beijing (CN) 100009

( * ) Notice: Subject to any disclaimer, the term of this patent is extended or adjusted under 35 U.S.C. 154(b) by 318 days.

(21) Appl. No.: 10/862,086

(22) Filed: Jun. 5, 2004

(65) Prior Publication Data

US 2005/0269575 A1    Dec. 8, 2005

(51) Int. Cl.
*H01L 21/00* (2006.01)
(52) U.S. Cl. .......................................... 438/22; 438/47
(58) Field of Classification Search ................ 438/22, 438/37, 46, 47, 455, 459, 464
See application file for complete search history.

(56) References Cited

U.S. PATENT DOCUMENTS

| | | | |
|---|---|---|---|
| 6,320,206 B1 | 11/2001 | Coman et al. | |
| 6,492,625 B1 | 12/2002 | Boguslavskiy et al. | |
| 6,679,947 B1 | 1/2004 | Koike et al. | |
| 2004/0021142 A1* | 2/2004 | Kuo | 257/79 |
| 2006/0057752 A1* | 3/2006 | Yang | 438/26 |
| 2006/0145177 A1* | 7/2006 | Hagimoto et al. | 257/99 |

* cited by examiner

*Primary Examiner*—Tuan H. Nguyen

(57) ABSTRACT

The vertical semiconductor chips or devices have all of advantages of flip chip technique and without its disadvantages. The present invention discloses methods of mass production of the vertical semiconductor chips or devices comprising GaN, GaInP, and GaInNP based LEDs with higher crystal quality, higher throughput, higher yield, and lower cost. The methods comprise the following process steps in the order presented: growing a first-type cladding layer, disposing a reflector/Ohmic layer, disposing a second intermediate layer, disposing an electrically conductive supporting plate, removing the original substrate and the first-type cladding layer exposed, growing an epitaxial layer comprising an active layer and a second-type cladding layer, disposing a second-electrode, and dicing into individual dies.

11 Claims, 17 Drawing Sheets

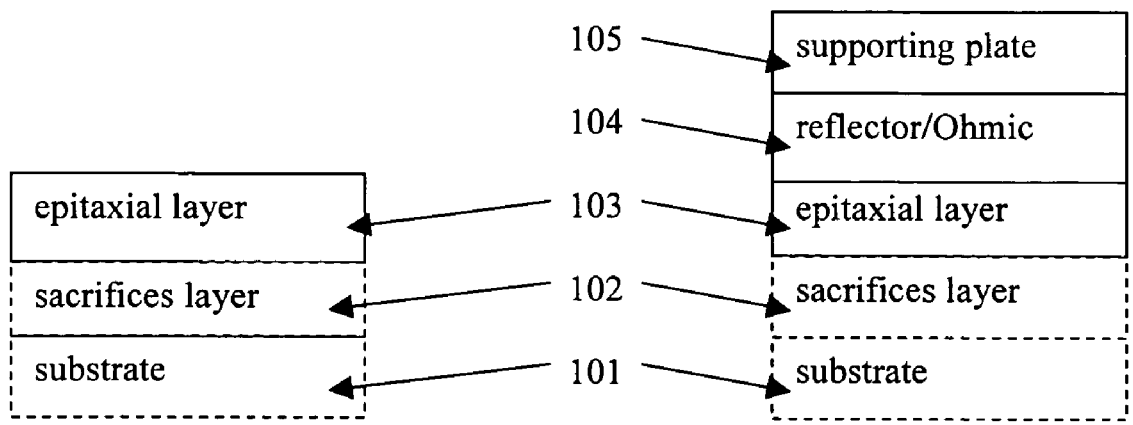
FIG. 1a prior art
FIG. 1b prior art
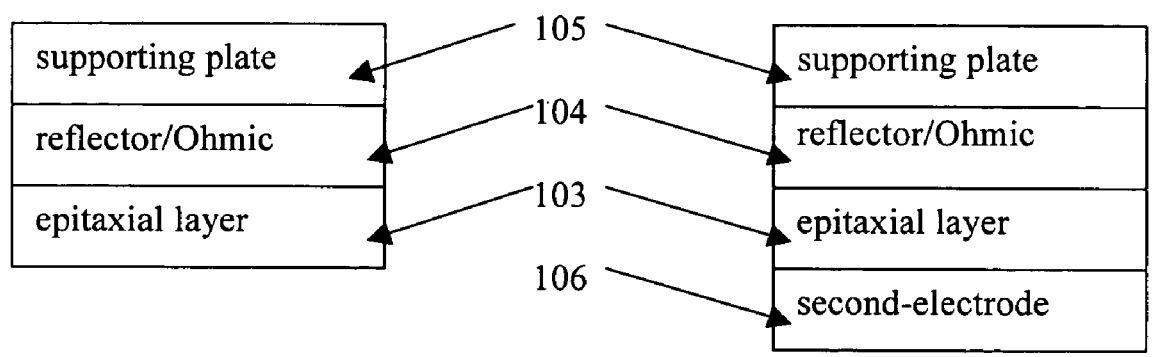
FIG. 1c prior art
FIG. 1d prior art

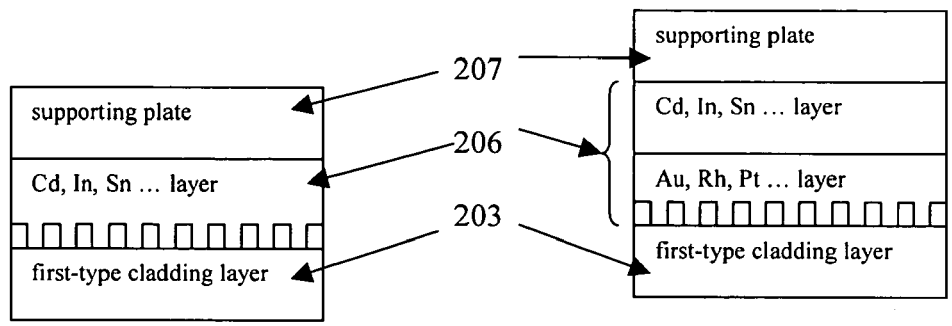
FIG. 2e    FIG. 2f
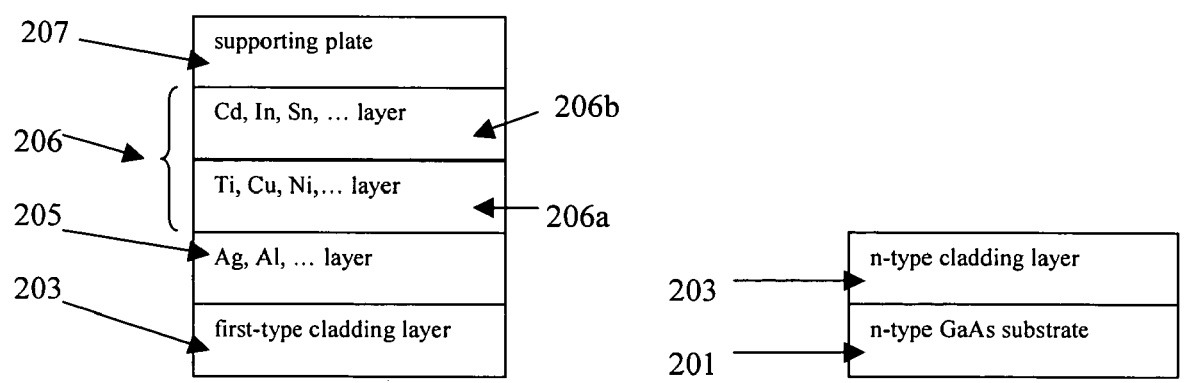
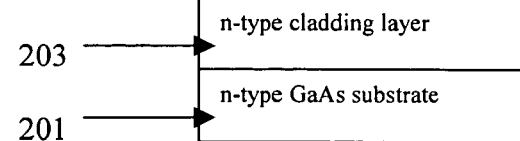
FIG. 2g    FIG. 2h

VERTICAL SEMICONDUCTOR DEVICES OR CHIPS AND METHOD OF MASS PRODUCTION OF THE SAME

BACKGROUND OF THE INVENTION (1) Field of the Invention

The present invention relates to vertical semiconductor chips or devices including GaN, GaInP, and GaInNP based LEDs, especially for high power LEDs, and methods of mass production of the same.

(2) Prior Art

There are varieties of prior art discussing vertical semiconductor devices or chips and method of manufacturing the same. Main advantages associated with the vertical structure comprise the following: (1) vertical semiconductor devices or chips have all of advantages of flip chip technique including fast heat dissipation and without its disadvantages, such as complex process steps, low throughput, and expensive equipments; (2) two electrodes are on the two opposite sides of a vertical semiconductor device or chip and, thus, current distributes more uniformly, current density is higher, ESD property is improved.

U.S. Pat. No. 6,320,206 by Coman, et al. disclosed methods for removing sapphire substrate for GaN based LEDs by laser lift-off. However the electrical and optical properties of LEDs are depended on crystal quality of the epitaxial layers that is subjected to additional chemical process steps (e.g. etching), mechanical process steps (e.g. lapping), and laser lift-off process steps. It may be needed for laser beam to scan an epitaxial wafer more than one times, which decreases the throughput and increases the chance of damaging the epitaxial layer of LEDs. Also the laser lift-off equipment is expensive.

For removing original substrates and growing a thick semiconductor layer as a semiconductor substrate for further application of semiconductor devices including LEDs, U.S. Pat. No. 6,679,947 by Koike et al. disclosed a method comprising following process steps: disposing a metal layer having low melting point on the original substrate, growing a semiconductor substrate of about 100.mu.m thick on it, and then removing the original substrate by dissolving the metal layer and separating the semiconductor substrate from the original substrate. To grow a thick semiconductor substrate in this way, however, is very expensive. Also semiconductor devices or chips grown on the so-obtained semiconductor substrate do not have the advantages of flip chip technique.

It is important to maintain a uniform temperature over the surface of a substrate being processed in epitaxial growing. U.S. Pat. No. 6,492,625 disclosed the apparatus and method for controlling temperature uniformity over the whole surface of the substrate. Substrate temperature non-uniformity may result in deviation from target wavelength and intensity of emitted light. In a worse case scenario, the edge of a sapphire substrate may slightly warp and bowl and, thus, not contact to the susceptor well during the epitaxial growth in MOCVD. As a consequences, the composition and quality of disposed epitaxial layer over the substrate is not uniform. Therefore, LED chips on an about 5 mm ring from the edge of the substrate are not qualified, i.e., the yield is lower.

When a GaN epitaxial layer growing on an original substrate at about 1050 degree C., there is no stress due to the different in the thermal expansion coefficients of the original substrate and the epitaxial layer. Then the temperature is cooled down to room temperature of about 20 degree C., both the epitaxial layer and the original substrate constrict for a temperature range of about 1000 degree C. Therefore the different in the thermal expansion coefficients of the original substrate and the epitaxial layer causes a stress which affects the crystal quality of the epitaxial layer.

Therefore there are increasing demands for methods of cost effectively and massively producing vertical semiconductor chips or devices with higher crystal quality and without disadvantages mentioned above.

BRIEF SUMMARY OF THE INVENTION

In the present invention, vertical semiconductor chips or devices and methods for mass production of the same are disclosed. High power GaN based LEDs are used as preferred embodiments of the present invention. However, the methods of the present invention are also applicable to other semiconductor chips or devices.

The methods of the present invention have the following advantages.

1. Since the methods of the present invention are to grow an active layer after removing the substrate, the substrate removing process has no damage on the crystal quality and electrical-optical properties of the vertical semiconductor chips and devices.

2. For embodiments of the present invention, a Cu plate (or an electronically conductive Si wafer with high thermal conductivity) is employed as a supporting plate and a second intermediate layer with low melting point (such as Sn, Cd, or In (indium) metal layer) disposes between the supporting plate and the epitaxial layer. At the growth temperature of the epitaxial layer, the second intermediate layer is dissolved, the first-type cladding layer is floating on the top of the supporting plate. Therefore, the difference in the thermal expansion coefficients of the supporting plate and the epitaxial layer will not produce warp and/or bowl of the supporting plate. The supporting plate contacts the susceptor very well, and, thus, the temperature over the whole supporting plate and, thus, the whole epitaxial layer is uniform, so that the composition and crystal quality of the epitaxial layer disposed over the supporting plate is uniform.

On the other hand, after growing the epitaxial layer, the supporting plate and the epitaxial layer on it start to cool down, when near the room temperature (about 197 degree C. for In), the second intermediate layer turns to solid state, so the difference in the thermal expansion coefficients of the supporting plate and the epitaxial layer will not produce significant stress in the epitaxial layer for a temperature range of about 200 degree C. Therefore, yield and crystal quality are higher.

3. Several embodiments of the present invention employ Si wafers as substrates which are cheaper and may be easily processed.

4. For several embodiments of the present invention, the removed original substrates are re-useable to lower the manufacturing cost.

5. Two electrodes are on the opposite sides of a vertical semiconductor device or chip, the top electrode may be so patterned and arranged that the current crowding effect is reduced, the material of active layer is fully utilized, and the current distributes more evenly. Therefore the current density may be higher, and the vertical semiconductor devices or chips are brighter.

6. Two electrodes are on the opposite sides of a vertical semiconductor device or chip, therefore, the electrical static discharge (ESD) property is improved.

7. The vertical semiconductor chips or devices of the present invention have all of the advantages of flip chip technique, such as the fast heat dissipation, and without its disadvantage, such as the complex process, expensive equipments, and low throughput.

The primary object of the present invention is to provide methods for massively manufacturing vertical semiconductor chips or devices, including GaN, GaInP, and GaInNP based LEDs, with high crystal quality, lower cost, higher throughput, and high yield.

The second object of the present invention is to provide vertical semiconductor chips or devices, including high power GaN, GaInP, and GaInNP based LEDs, with better uniformity of wavelength and intensity of emitting light over whole epitaxial wafer.

The third object of the present invention is to provide vertical semiconductor chips or devices, including high power GaN, GaInP, and GaInNP based LEDs, with higher crystal quality of epitaxial layers by removing the original substrate before growing active layers.

The fourth object of the present invention is to provide vertical semiconductor chips or devices, including high power GaN, GaInP, and GaInNP based LEDs, with better ESD property.

The fifth object of the present invention is to provide vertical semiconductor chips or devices, including high power GaN, GaInP, and GaInNP based LEDs, with better extraction efficiency by eliminating totally internal reflections for GaN and GaInNP based LEDs and by eliminating the absorption of an original substrate for GaInP based LEDs.

Further objects and advantages of the present invention will become apparent from a consideration of the ensuing description and drawings.

BRIEF DESCRIPTION OF THE SEVERAL VIEWS OF DRAWINGS

The novel features believed characteristic of the present invention are set forth in the claims. The invention itself, as well as other features and advantages thereof will be best understood by referring to detailed descriptions that follow, when read in conjunction with the accompanying drawings.

FIG. 1a to FIG. 1d show a schematic manufacturing process for a vertical semiconductor device or chip bonded on a supporting plate of prior art with laser lift-off.

FIG. 2e and FIG. 2f show preferred embodiments of manufacturing process for vertical semiconductor devices or chips of the present invention without disposing reflector/Ohmic layer.

FIG. 2g shows a preferred embodiment of manufacturing process for vertical semiconductor devices or chips of the present invention with disposing reflector/Ohmic layer.

FIG. 2h shows a preferred embodiment of manufacturing process for vertical semiconductor devices or chips of the present invention with a GaAs substrate for GaInP based LEDs.

Figure 4A:
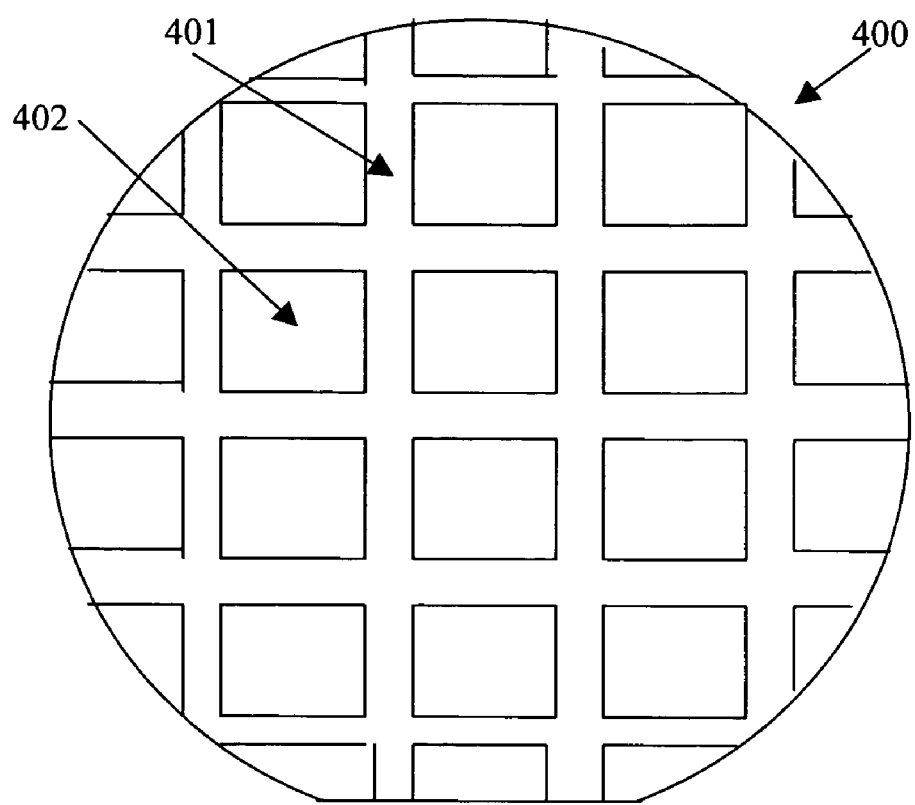
FIG. 4a shows the top surface of a first-type cladding layer with patterned texture.
Figure 4B:
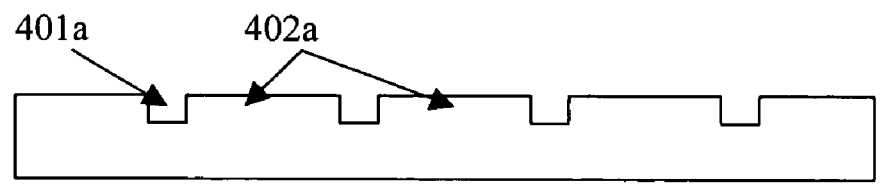
Figure 4C:
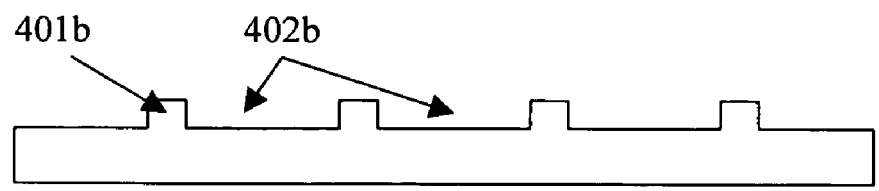

FIG. 4b and FIG. 4c respectively show cross sectional views of first-type cladding layers with different patterned textures.

FIG. 5a to FIG. 5k show preferred embodiments of patterned second electrodes of the vertical semiconductor devices or chips of the present invention.

Figure 5A:
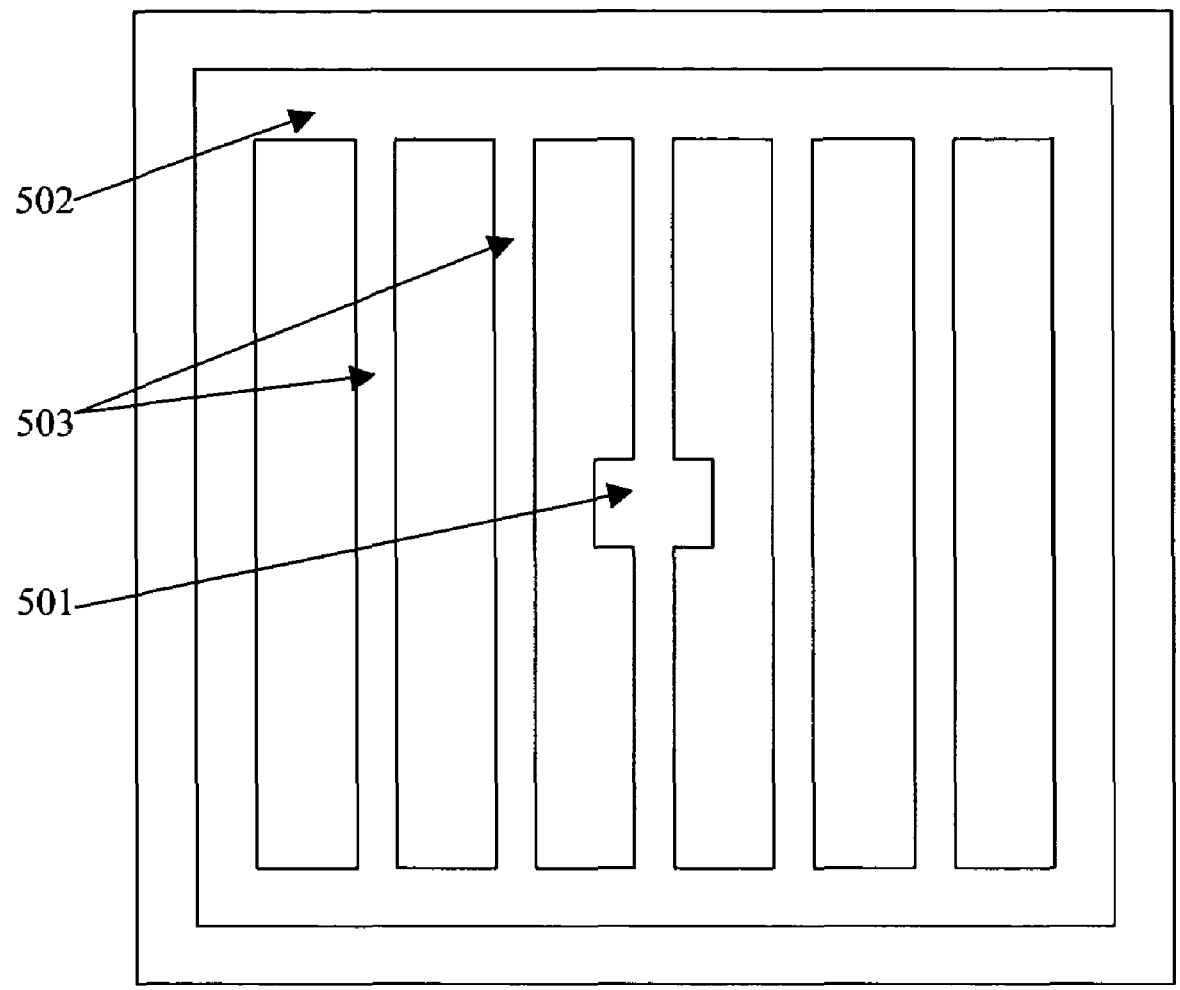

FIG. 5a is a top view of a strip-ring-shaped second electrode with one wire bonding pad at the center.

Figure 5B:
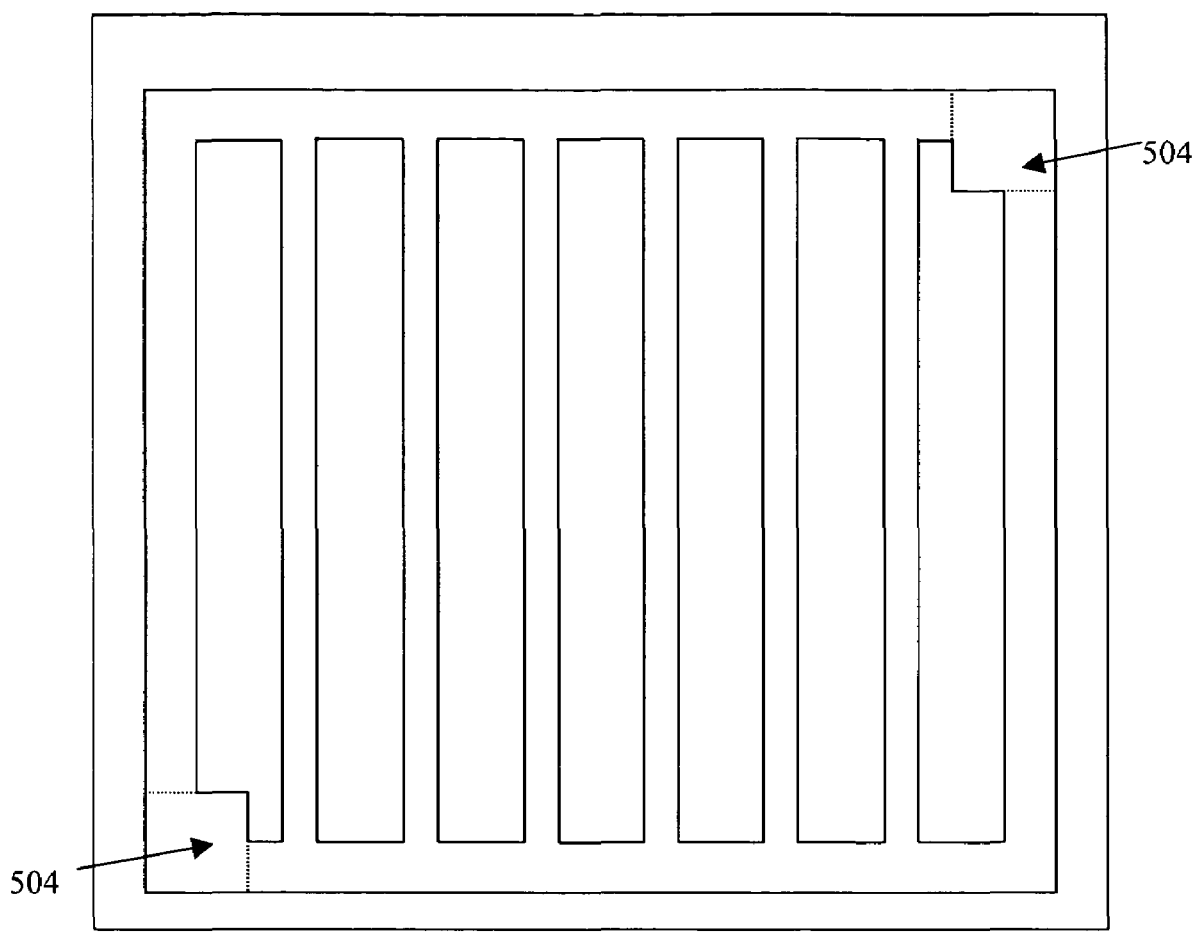

FIG. 5b is a top view of a strip-ring-shaped second electrode with two wire bonding pads at two diagonal corners respectively for introducing high current density.

Figure 5C:
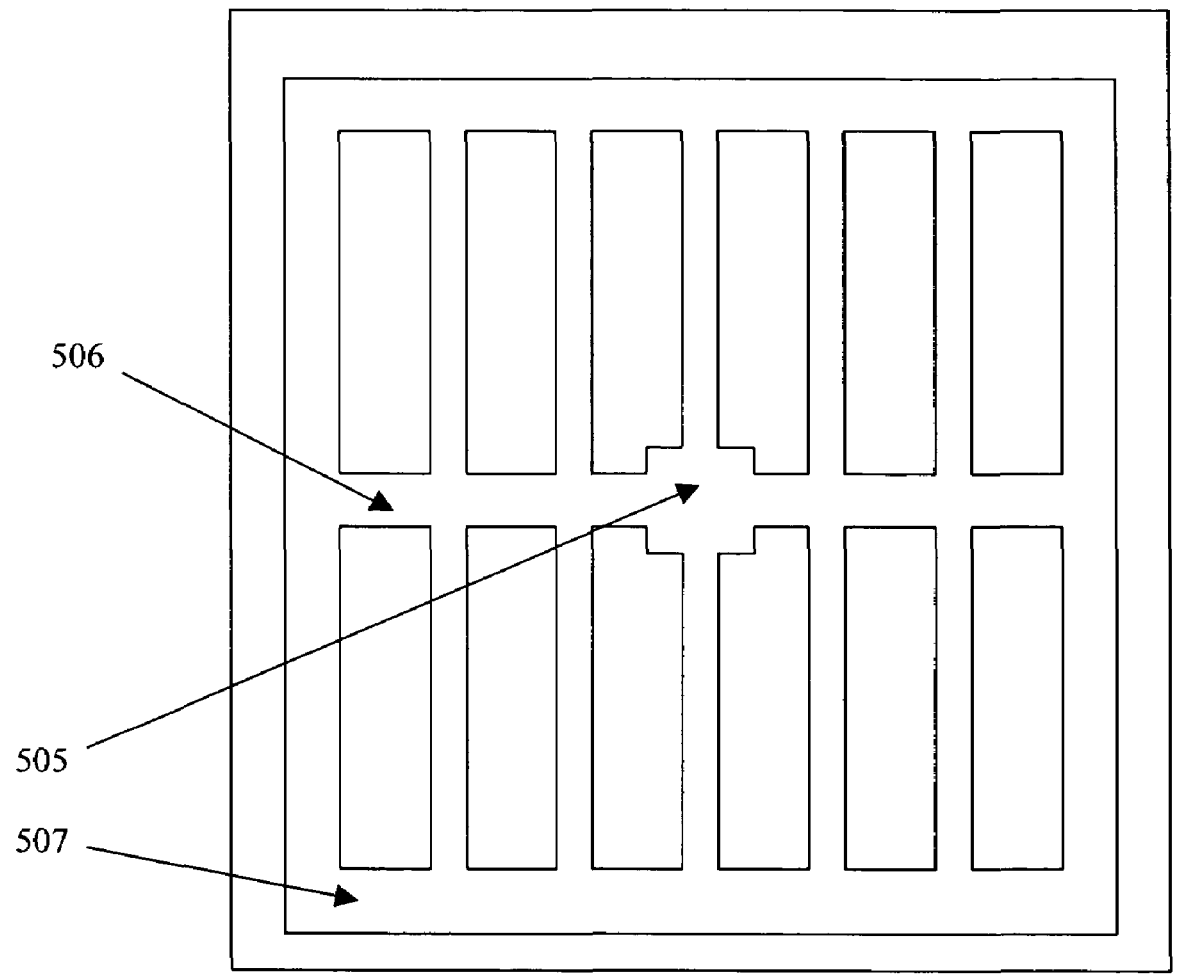
Figure 5D:
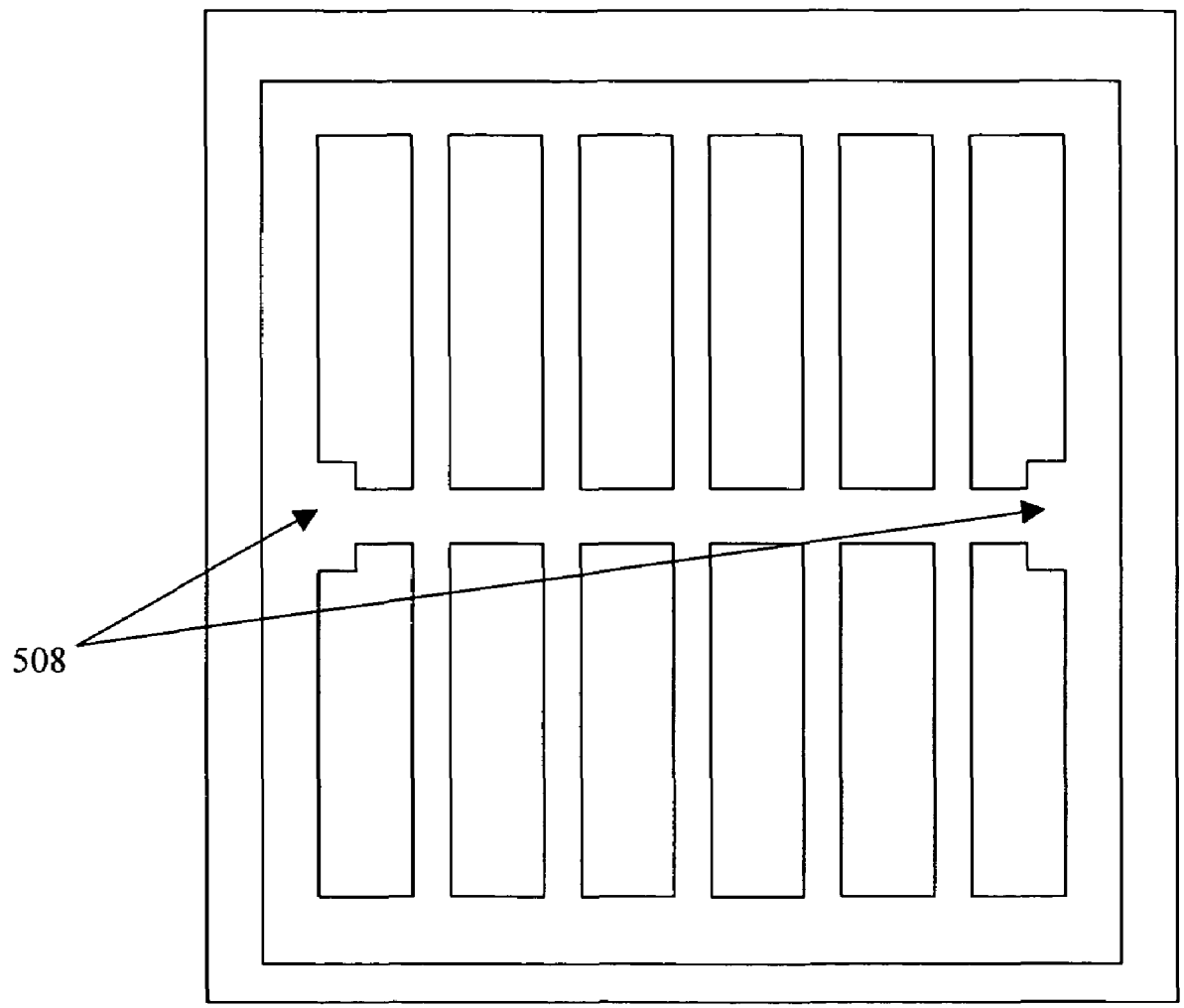

FIGS. 5c and 5d are top views of grid-ring-shaped second electrodes with one and two wire bonding pads respectively and with one horizontal strip.

Figure 5E:
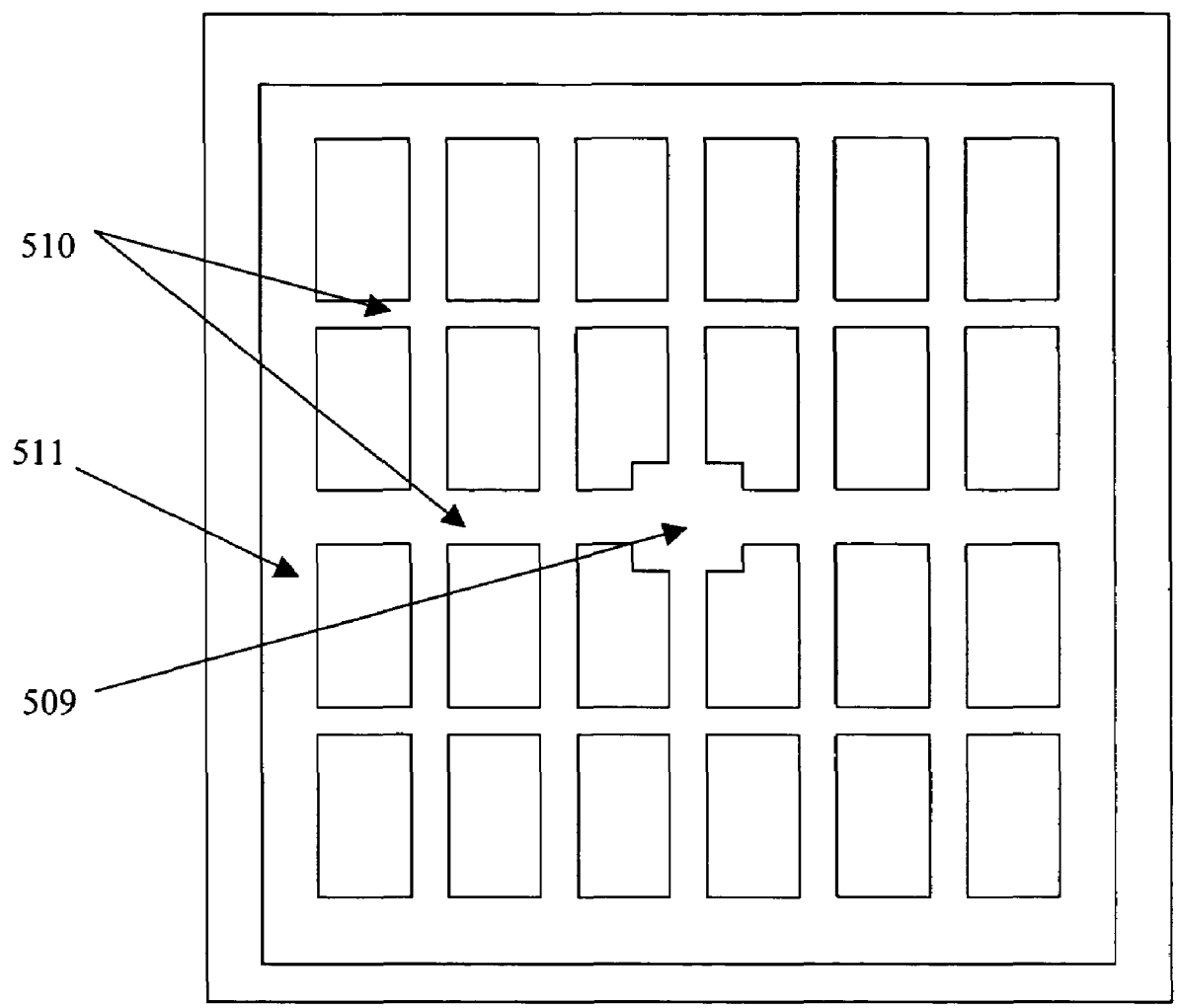
Figure 5F:
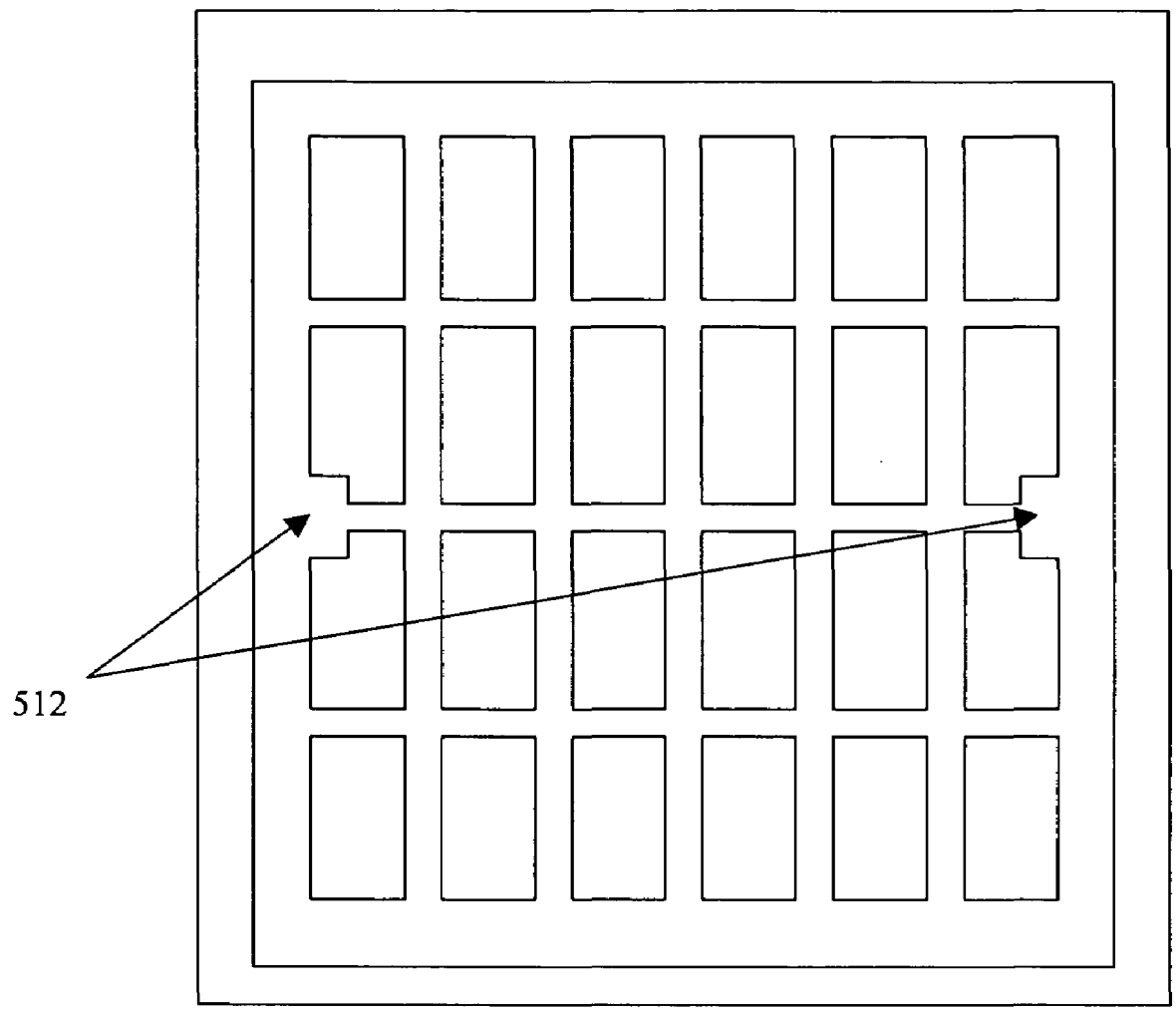

FIGS. 5e and 5f are top views of grid-ring-shaped second electrodes with one and two wire bonding pads respectively and with multiple of horizontal strips.

Figure 5G:
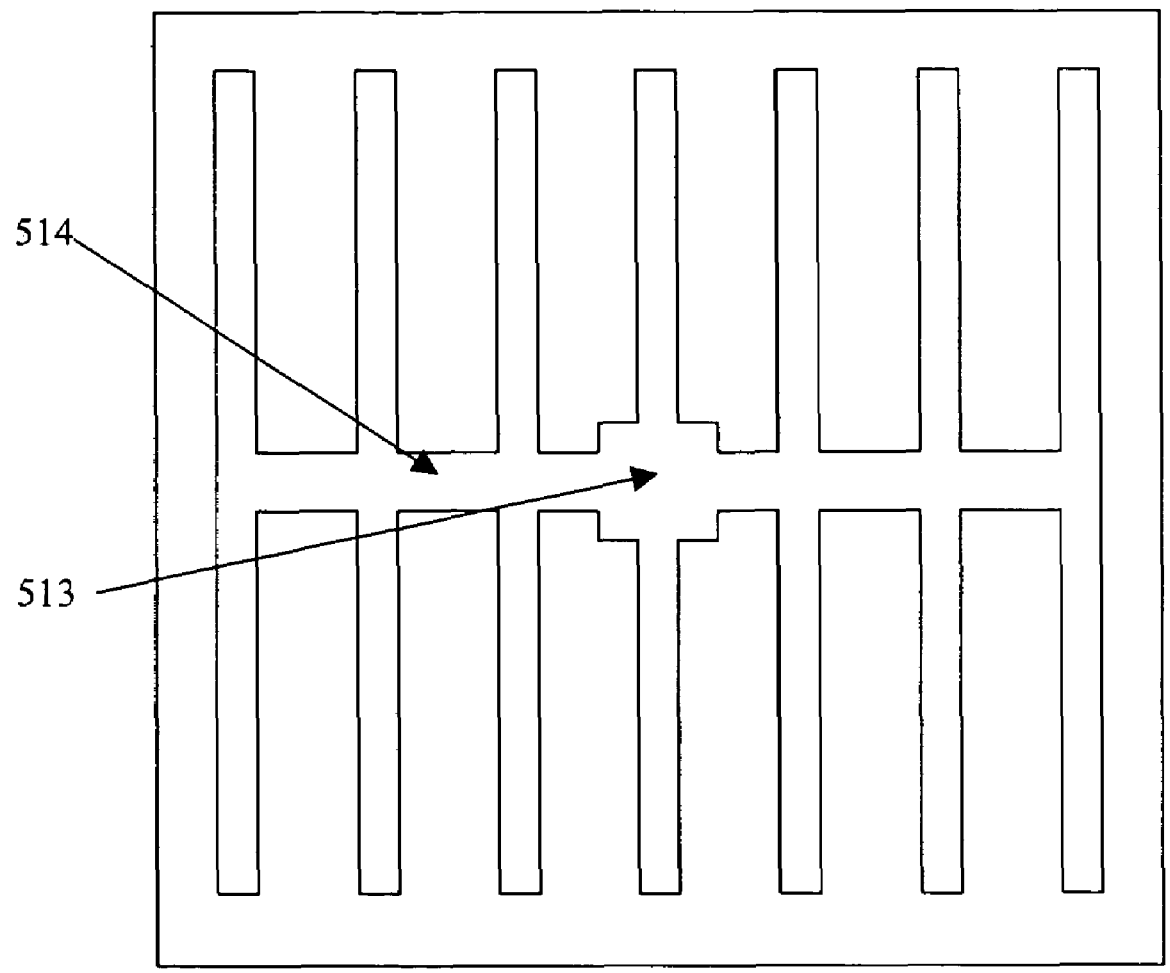
Figure 5H:
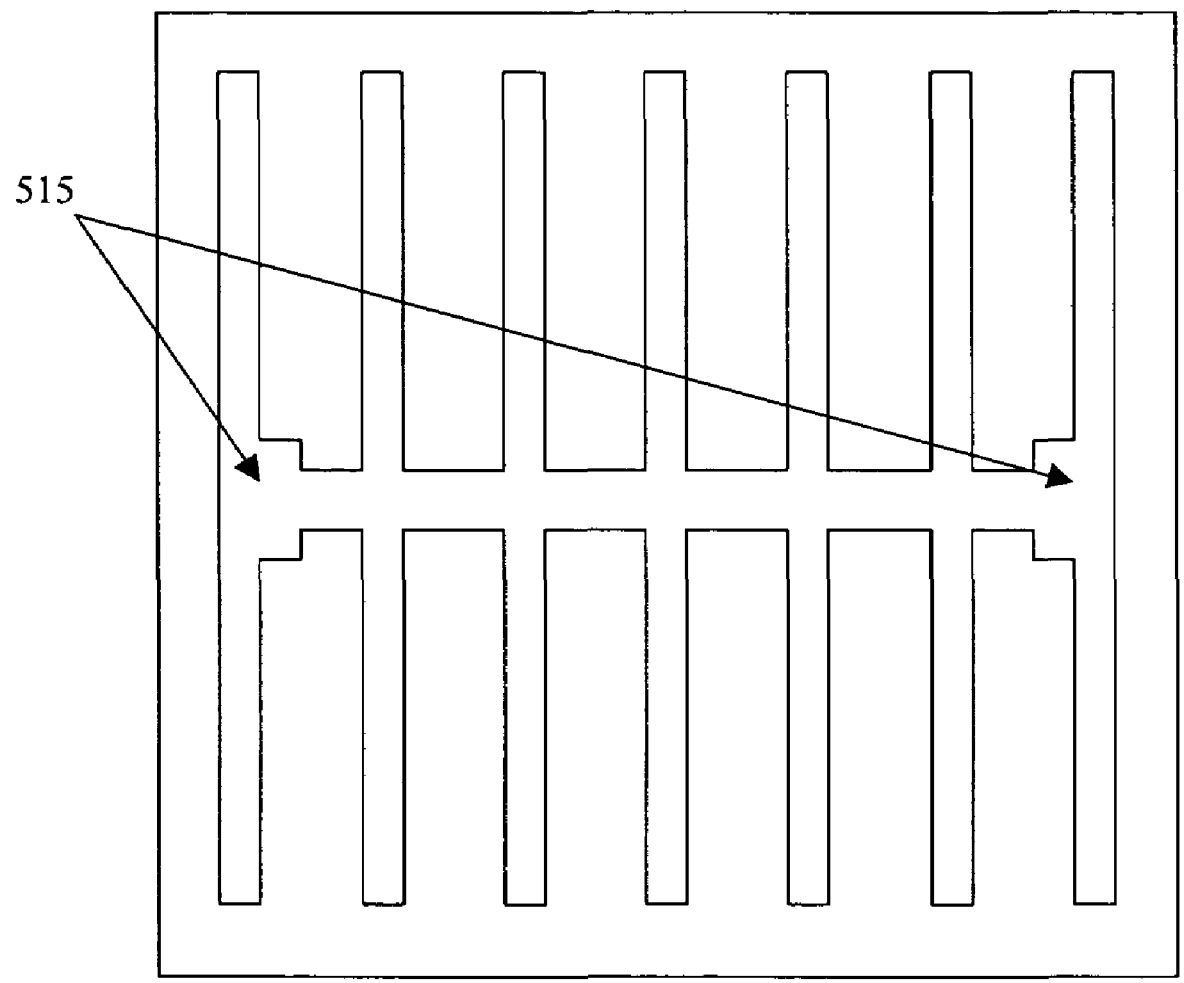

FIGS. 5g and 5h are top views of grid-shaped second electrodes with one and two wire bonding pads respectively and with one horizontal strip.

Figure 5I:
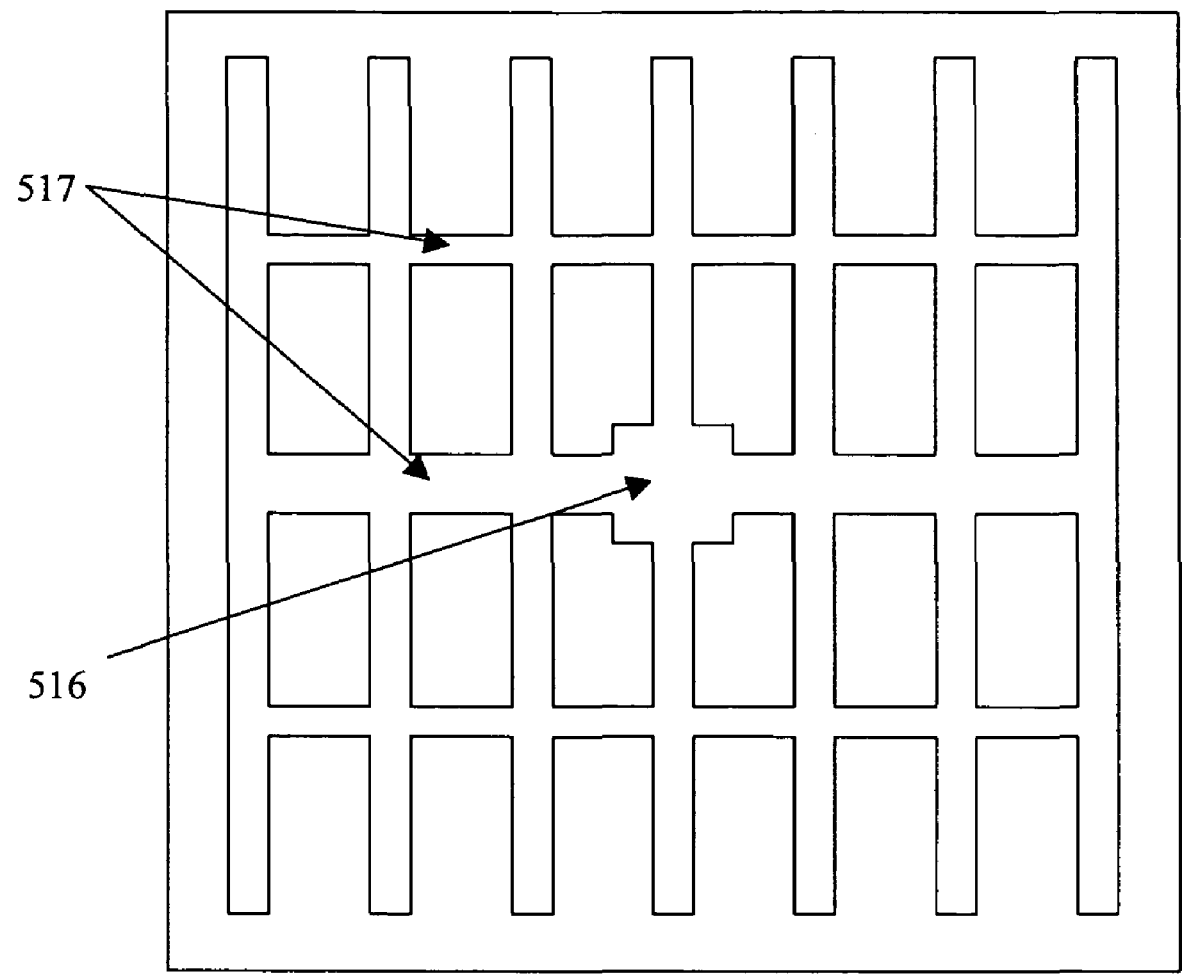
Figure 5J:
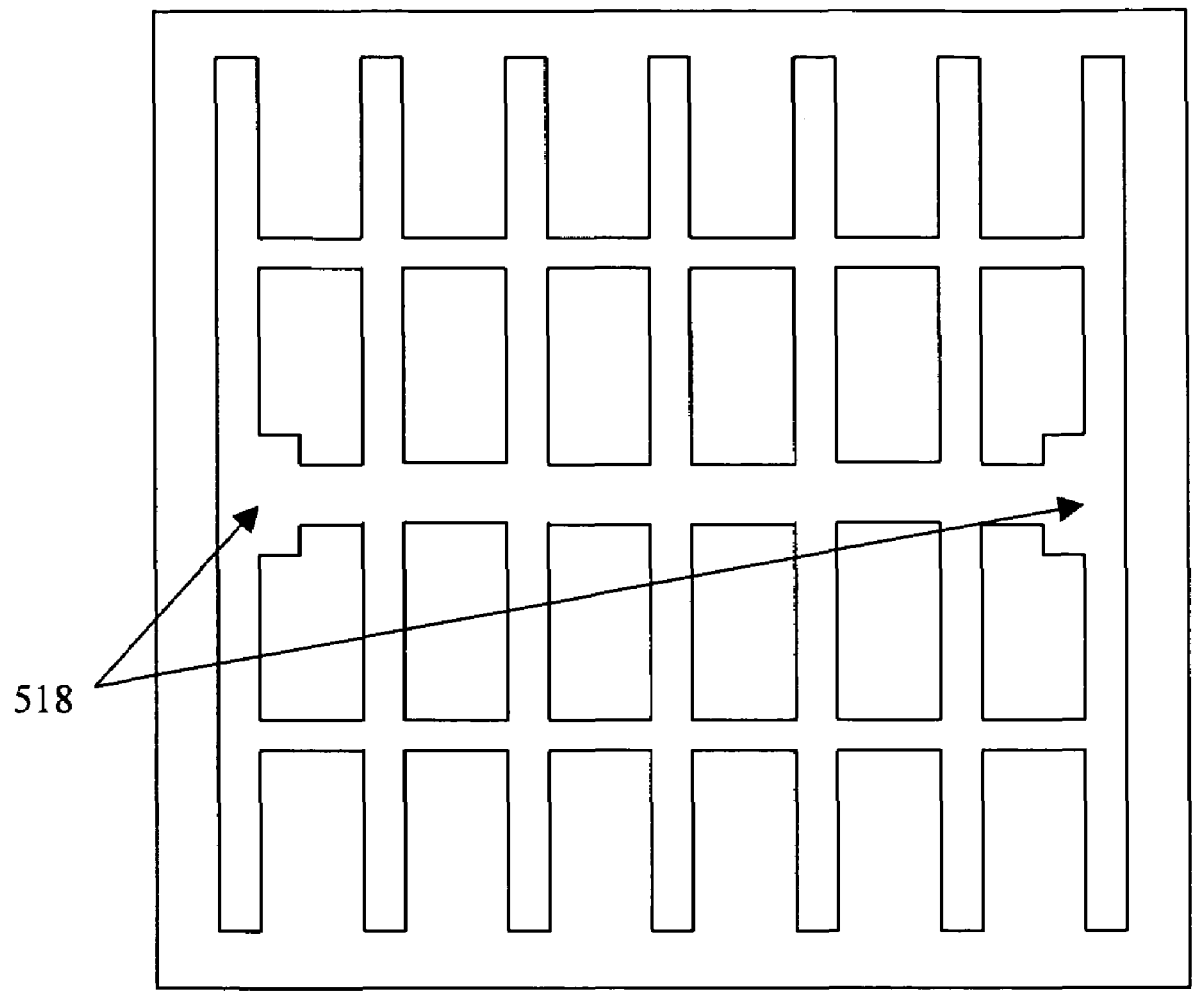

FIGS. 5i and 5j are top views of grid-shaped second electrodes with one and two wire bonding pads respectively and with multiple of horizontal strips.

Figure 5K:
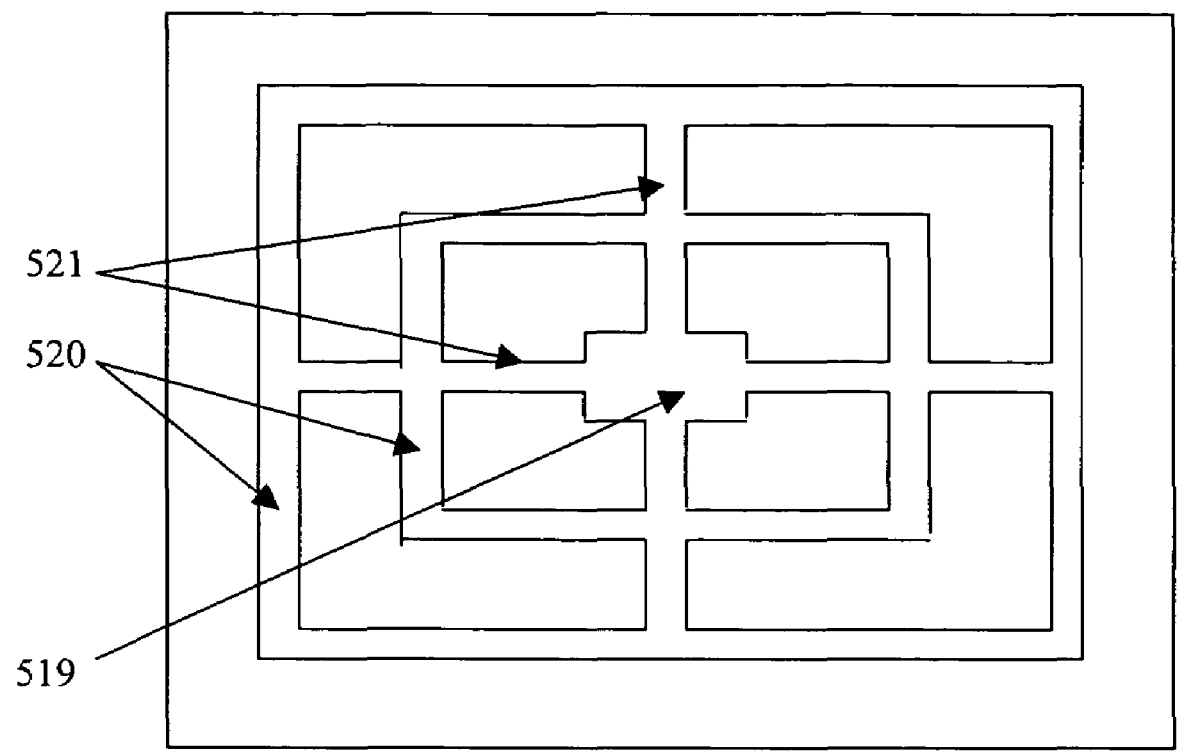

FIG. 5k is a top views of multi-ring-cross-shaped second electrodes with one wire bonding pad at the center.

DETAILED DESCRIPTION OF THE INVENTION

While embodiments of the present invention will be described below, those skilled in the art will recognize that other manufacturing processes and other patterned second electrodes are capable of implementing the principles of the present invention. Thus the following description is illustrative only and not limiting.

Reference is specifically made to the drawings wherein like numbers are used to designate like members throughout.

Note the followings:

(1) The dimensions of all of drawings are not to scale.

(2) GaN, GaInP, and GaInNP based LEDs as embodiments of the present invention are illustrated in the FIG. 2 to FIG. 4. However the same manufacturing processes are applicable to other semiconductor chips or devices.

(3) The material of an active layer of semiconductor chips or devices of the present invention may be selected from a group comprising combinations of Al (aluminum), As (arsenic), Ga (gallium), In (indium), P (phosphorous) and N (nitrogen), such as GaN, GaP, GaInN, GaInP, AlGaN, AlGaInN, AlGaInP, GaInNP, and AlGaInNP; wherein GaInNP and AlGaInNP have been disclosed for single chip white LEDs.

(4) An active layer of semiconductor chips or devices of the present invention comprises a single quantum well structure and multi-quantum well structure.

(5) An embodiments of reflector/Ohmic layer of the present invention comprises a DBR (distributed Bragg reflectors) that fulfills the conditions comprising: (1) the DBR is electrically conductive; (2) the DBR is in a solid state at the temperature of growing the epitaxial layer; (3) The DBR disposes on the flat surface of a first-type cladding layer.

(6) The plurality of wire bonding pads of the second-electrode has the same electric polarity. The supporting plate serves as the first-electrode and has an opposite electric polarity.

FIG. 1 is a schematic manufacturing process steps of prior art for a vertical semiconductor devises or chips including GaN based LEDs. Sacrifices layer 102 is sandwiched between substrate 101 and epitaxial layer 103. Epitaxial layer 103 includes an active layer which emits light and is not shown in FIG. 1. Disposing reflector/Ohmic layer 104 on epitaxial layer 103. Bonding electrically conductive supporting plate 105 to reflector/Ohmic layer 104. Applying a laser beam on sacrifices layer 102 to separate substrate 101 from epitaxial layer 103 and epitaxial layer then is exposed. Finally patterning second-electrode 106 which is disposed on epitaxial layer 103.

One of main drawback is that it is needed to let laser beam scan whole wafer more than once to completely separate substrate 101 from epitaxial layer 103. This laser lift-off process step may lower the production throughput and increase the chances to damage epitaxial layer 103. Other drawbacks are: growing sacrifices layer 102 adds an extra cost, especially when it is thick, and laser beam heating will de-composite GaN into Ga+N.

FIG. 2a to 2h show embodiments of schematic manufacturing process of the present invention for vertical semiconductor chips or devices.

First Embodiment: FIG. 2a to 2g.

The selections of a structure and a material of first intermediate layer 202 depend on the selection of both a substrate removing process and a material of substrate 201. For different substrate removing processes, the structure and material of first intermediate layer 202 are different For GaN based LEDs, a common choice of substrate 201 is a sapphire substrate. Two processes to remove sapphire substrate 201 are disclosed.

The first sapphire substrate removing process is to remove both sapphire substrate 201 and first intermediate layer 202 by precisely lapping/polishing before growing an epitaxial layer comprising an active layer. First intermediate layer 202 comprises one or multiple buffer layers. First-type cladding layer 203 is grown on the top of the buffer layers, and preferably is an n-type cladding layer. Textured top surface 204 of first-type cladding layer 203 is formed by either dry or wet etching (details is disclosed in FIG. 4) for significantly reducing the stress due to the difference in the thermal expansion coefficients of first-type cladding layer 203 and reflector/Ohmic layer 205 which is disposed on textured top surface 204 by vacuum evaporation (electron beam, thermal, or sputter).

Figures 2A, 2B:
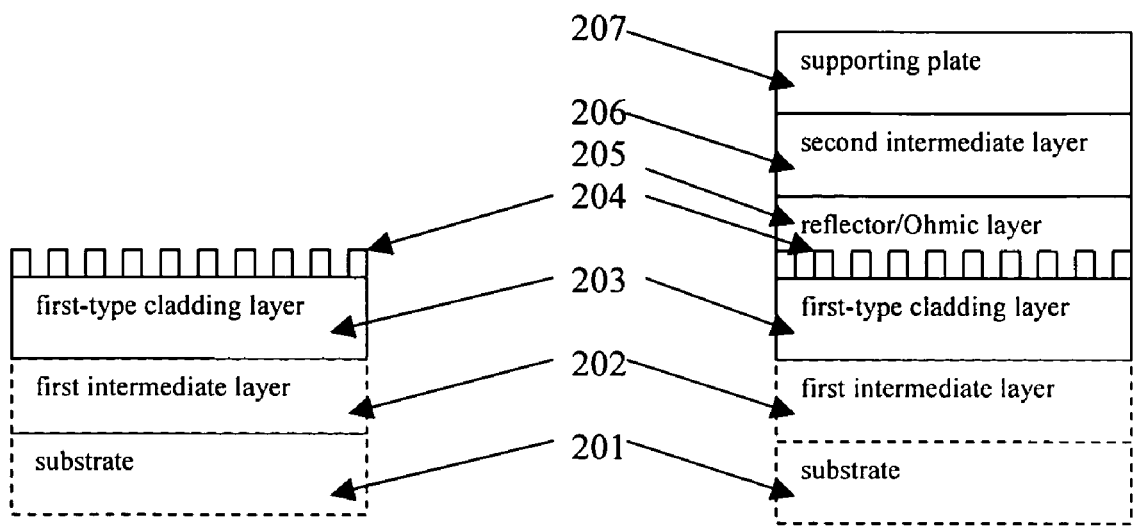
FIG. 2a to FIG. 2d show a preferred embodiment of manufacturing process for vertical semiconductor devices or chips of the present invention.
Figures 3A, 3B:
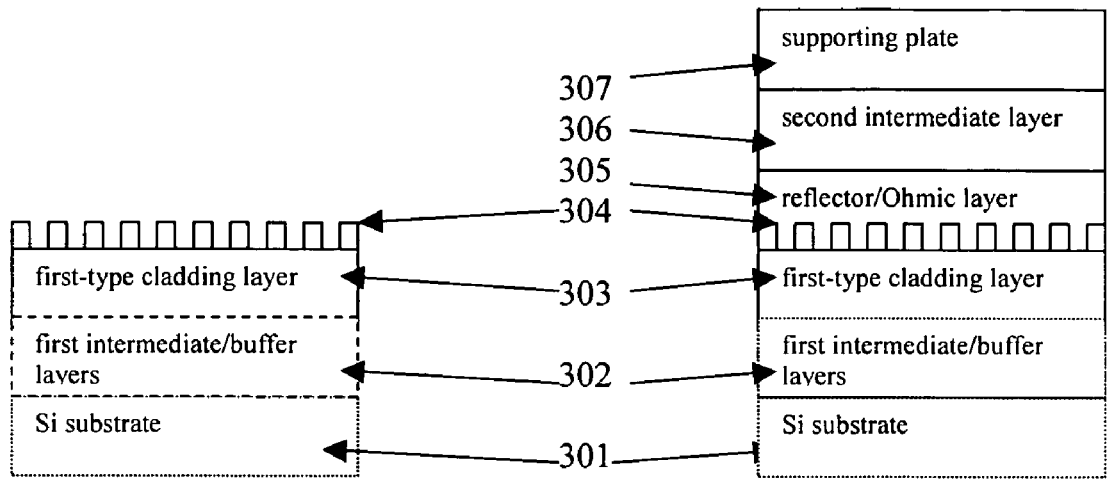
FIG. 3a to FIG. 3d show a preferred embodiment of the manufacturing process for vertical semiconductor devices or chips of the present invention with a Si substrate.
Figures 3C, 3D:
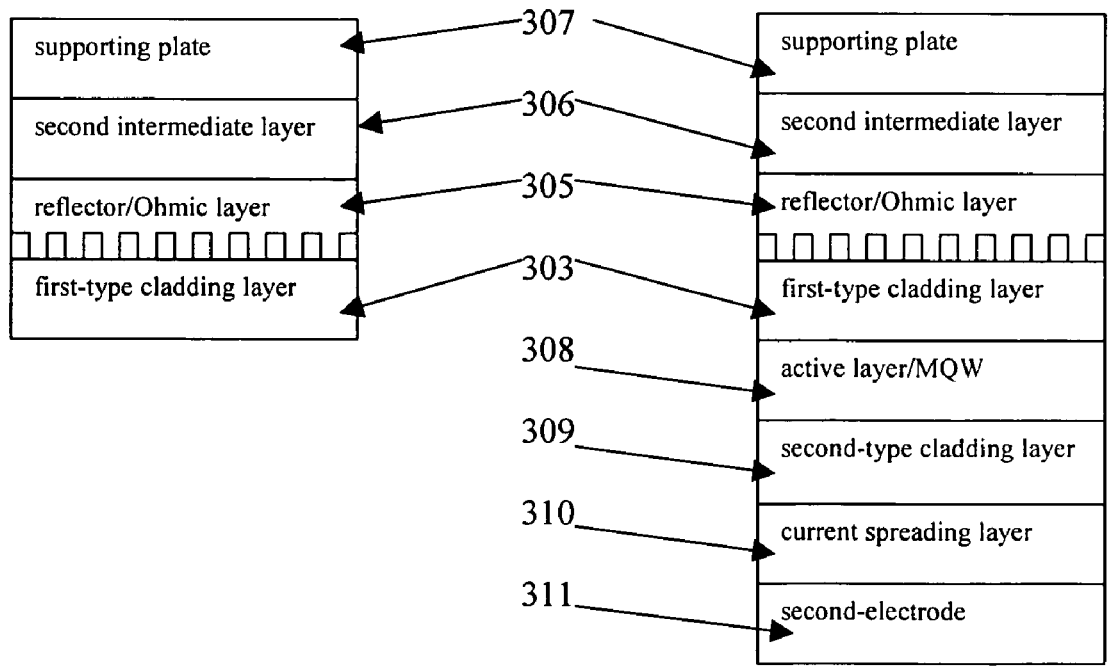

In FIG. 2b, second intermediate layer 206 is formed by vacuum evaporation and sandwiched between reflector/Ohmic layer 205 and supporting layer 207. A selection of a structure and a material of second intermediate layer 206 depend on the selection of material of reflector/Ohmic layer 205 (FIG. 2e to FIG. 2g disclose several embodiments in details). Reflector/Ohmic layer 205 may also be DBR The structure of second intermediate layer 206 comprises either one or plurality of metal layers. Supporting layer 207 is electrically conductive, has better heat conductivity, and disposed on second intermediate layer 206 by variety methods comprising electroplating, electro-less plating, wafer metal bonding, and vacuum evaporation. The material of supporting layer 207 may be selected from a group comprising Cu and Si.

Figures 2C, 2D:
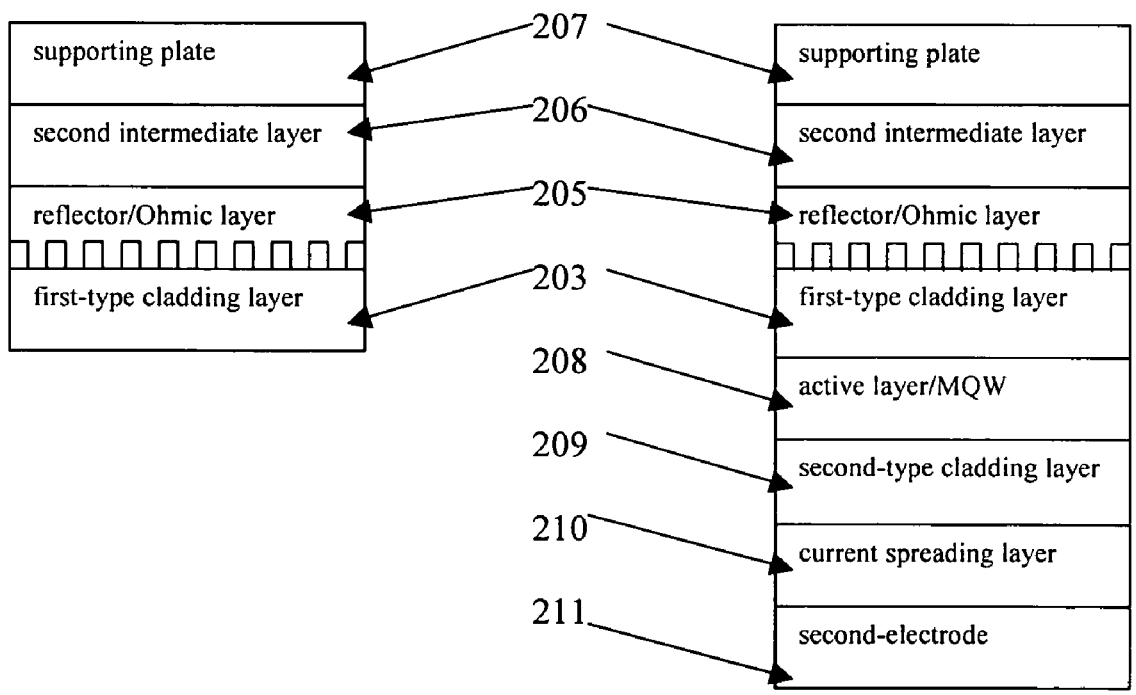

FIG. 2c shows that sapphire substrate 201 and first intermediate layer 202 are removed. Removing method is precisely lapping/polishing and etching for smoothing the surface. First-type cladding layer 203 is then exposed as shown.

Then, in FIG. 2d, supporting plate 207 with first-type cladding layer 203 on it is mounted on susceptor in MOCVD for growing an epitaxial layer comprising active layer 208 and second-type cladding layer 209. For better crystal quality, it is preferred that grow a thin first-type cladding layer on first-type cladding layer 203 before growing active layer 208. Embodiments of active layer 208 may also comprise a multi-quantum well (MQW) structure. Temperature of growing active layer 208 and second-type cladding layer 209 is higher than the melting point of at least one of metal layers of second intermediate layer 206, i.e., at least one of metal layers of second intermediate layer 206 is dissolved during the growth of epitaxial layer and becomes solid during the cooling down to room temperature after the growth. Therefore there is no significant stress between the epitaxial layer and supporting plate 207 due to the difference in the thermal expansion coefficients of both, so that supporting plate 207 will no be warped and bowled and contacts the susceptor very well during the growth process. Thus, the temperature is much uniform over the whole epitaxial layer which produces much uniform quality of the epitaxial layer. Current spreading layer 210 is sandwiched between second-type cladding layer 209 and patterned second-electrode 211 (FIG. 5 discloses embodiments of patterned second-electrode in detail). Finally supporting plate 207 with the epitaxial layer is diced into individual semiconductor devices or chips.

The second sapphire substrate removing process is by heating/separating method as show below. First intermediate layer 202 disposed on sapphire substrate 201 comprises: (1) a low melting point layer comprising a Cd, Sn, or In metal layer; (2) a high melting point layer comprising a Ti metal layer; (3) one or plurality of buffer layers selected from a group comprising AlN and GaN; and (4) their combinations. First-type cladding layer 203 is disposed on the buffer layer. When an In metal layer is selected as the low melting point layer of first intermediate layer 202, material of second intermediate layer 206 is selected from a group comprising Sn or Cd which having a melting point higher than that of the In metal layer. Therefore, during the heating/separating removing process, only the In metal layer dissolved. To separate substrate 201 from first-type cladding layer 203, heating up supporting plate 207 until the In metal layer dissolved, then separating substrate 201 from first-type cladding layer 203. The methods of separating comprise shearing. After separation, etching the surface until first-type cladding layer 203 exposed and having a smooth surface. The rest process steps comprising growing an epitaxial layer, disposing a current spreading layer, and disposing a second-electrodes, are the same as that of the first sapphire substrate removing process. The removed sapphire substrate is reusable.

Actually for the second substrate removing process, substrate may be made of other materials comprising GaN.

The whole area of supporting plate 207 is as first-electrode.

Note that the crystal quality of so grown epitaxial layer is higher, because of the following: (1) it is preferred to grow an extra layer of first-type cladding film on the exposed surface of first-type cladding layer 203 before growing active layer 208; (2) the substrate remove processes are performed before growing the epitaxial layer including active layer; (3) during the growth of the epitaxial layer, at least one layer of second intermediate layer 206 is dissolved, so supporting plate 207 will not warp or bowl and contact the susceptor well, and transfers heat more uniformly to the epitaxial layer; (4) the dissolved metal layer of second intermediate layer 206 becomes solid at the temperature near the room temperature, therefore there is no significant stress due to the difference in thermal expansion coefficient between supporting layer 207 and reflector/Ohmic layer 205 at room temperature; (5) textured top surface 204 localizes and minimizes the stress between first-type cladding layer 203 and reflector/Ohmic layer 205 due to the difference in thermal expansion coefficients.

FIG. 2e shows an embodiment in which second intermediate layer 206 only has a low melting point metal layer selected from a group comprising Cd, In, and Sn, and is sandwiched between supporting plate 207 and first-type cladding layer 203. There is no reflector/Ohmic layer for this embodiment FIG. 2f shows another embodiment in which second intermediate layer 206 comprising (1) a low melting point metal layer selected from a group comprising Cd, In, and Sn, and disposed on supporting plate 207, and (2) a high melting point metal layer having a high reflectivity and being selected from a group comprising Au, Rh, Ni, Pt, and their alloy, disposed between first-type cladding layer and the low melting point metal layer. The melting points (equal to or higher than 1064 degree C.) of the high melting point metal layer are higher than the growing temperature of the epitaxial layer (about 1050 degree C.). In this embodiment, the high melting point metal layer serves as a reflective layer.

An embodiment of reflector/Ohmic layer 205 and second intermediate layer 206 is shown in FIG. 2g. A material for reflector/Ohmic layer 205 is selected from a group comprising Ag and Al. The melting temperatures (lower than 965 degree C.) of those metals are lower than the growing temperature of the epitaxial layer (about 1050 degree C.). Therefore the material of reflector/Ohmic layer 205 is dissolved during the growth of the epitaxial layer and, thus, a metal layer 206a which is in solid state at the growth temperature is needed, which comprises Ti, Cu, and Ni. The materials of a dissolved metal layer 206b of second intermediate layer 206 is selected from a group comprising In, Cd, and Sn.

Second embodiment: For GaInP based LEDs, such as AlGaInP, substrate 201 is selected from a group comprising n-type GaAs substrate as shown in FIG. 2h. First intermediate layer 202 is no longer needed. An n-type cladding layer, such as n-type AlGaInP, is directly disposed on n-type GaAs substrate. The rest process steps of manufacturing vertical GaInP based LEDs comprising disposing a reflector/Ohmic layer, disposing a second intermediate layer, disposing a support plate, removing substrate, growing an epitaxial layer, disposing a current spreading layer, and disposing a second-electrode, are the same as that for vertical GaN based LEDs. The n-type GaAs substrate may be removed by etching, precisely lapping/polishing, or their combination.

FIG. 3a to 3e show embodiments of schematic manufacturing process of the present invention for vertical GaN based LEDs with Si substrate.

Third Embodiment: FIG. 3a to FIG. 3d

For GaN based LEDs, first intermediate layer 302 serves as a buffer layer comprising AlN and GaN buffer layers growing on the (111) plane of Si substrate 301. To grow AlN, firstly, chemically clean polished Si substrate 301. Secondly, growing AlN single crystalline layer at 1100–1250 degree C. for thickness of about 100–200 nm and obtaining smooth and featureless surface. Thirdly, growing GaN buffer layer at temperature of 1050 degree C. Then first-type cladding layer 303 is grown on GaN buffer layer.

The process steps of texturing the top surface of first-type cladding layer 303, disposing reflector/Ohmic layer 305, disposing second intermediate layer 306, disposing supporting plate 307, removing Si substrate 301 and first intermediate layer 302, disposing a first-type cladding thin film of first-type cladding layer 303, growing active layer 3308 and second-type cladding layer 309, disposing current spreading layer 310 and patterned second-electrode 311, are the same as that shown in FIG. 2. The one of differences between the manufacturing process steps of FIG. 2 and FIG. 3 is the method of removing substrate. Si substrate 301 and intermediate layer 302 comprising AlN and GaN buffer layers may be removed by selectively etching alone which is a mature mass production process.

The drawback of traditionally growing GaN on Si substrate is that the GaN layer is deformed under a tensile stress, which is due to the difference in the thermal expansion coefficient between the GaN layer and the Si substrate. However, for the process of the present invention, the GaN buffer layer and Si substrate are removed before growing the epitaxial layer including active layer, therefore, the drawback is eliminated.

Figure 3E:
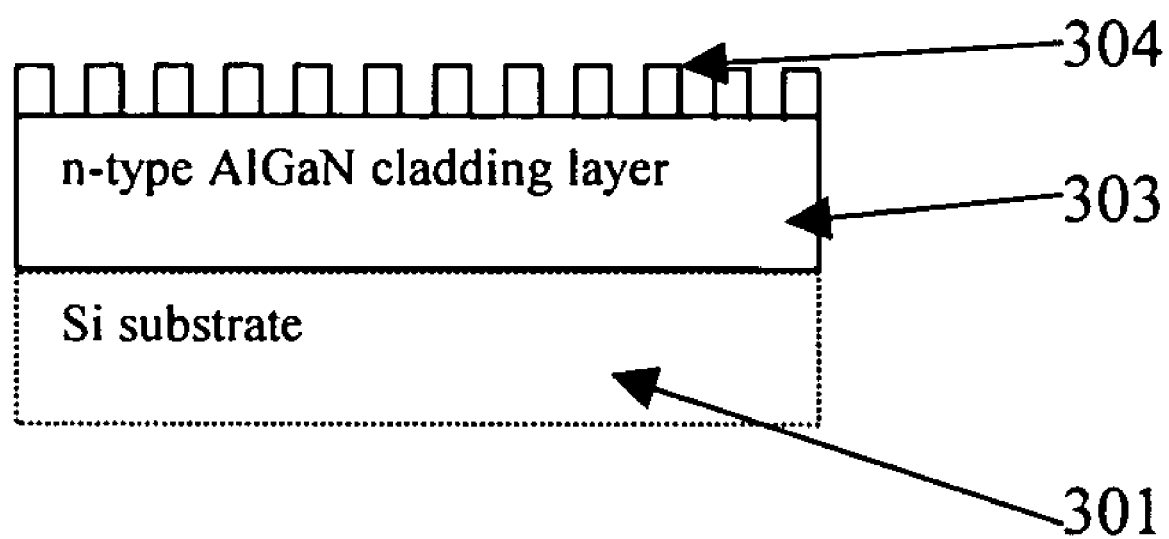
FIG. 3e shows another preferred embodiment of the manufacturing process for vertical semiconductor devices or chips of the present invention with a Si substrate and without buffer layers.

Fourth Embodiment: FIG. 3e.

An n-type AlGaN thin film (for example, Al.sub.0.07Ga.sub.0.93N having an electron density of $3.times.10.sup.17/cm.sup.3$), as a first-type cladding layer 303, may be directly grown (at about 1000 degree C.) on Si substrate 301. The rest process steps, starting with the process steps of texturing the top surface of first-type cladding layer 303 to the process step of disposing patterned second-electrode, are the same as that of the first embodiment of FIG. 3a to FIG. 3d.

FIG. 4a is a top view of textured top surface 400 formed by etching the top surface of first-type cladding layers 203 or 303 respectively. Textured top surface 400 comprises two types: mesa-type and well-type.

FIG. 4b is a cross sectional view of an embodiment of mesa-type textured top surfaces 400. Textured top surface 400 has mesa 402a and well-separator 401a, it is preferred to form mesa 402a having the same dimension as that of a semiconductor devise or chip, and to form well-separator 401a having the same dimension as that of a street which separates semiconductor devise or chips. The depth of well-separator 401a is in an order of nanometer to micron.

FIG. 4c is a cross sectional view of an embodiment of well-type textured top surfaces 400. Textured top surface 400 has well 402b and wall-separator 401b, it is preferred to form well 402b having the same dimension as that of a semiconductor devise or chip, and to form wall-separator 401b having the same dimension as that of a street which separates semiconductor devises or chips. The height of wall-separator 401b is in an order of nanometer to micron.

Textured top surface 400 will localize and minimize the stress due to the different in the thermal expansion coefficient between the first-type cladding layer and either the reflector/Ohmic or second intermediate layer. The selection of either a mesa-type or a well-type textured top surface depends on the difference of the thermal expansion coefficient between two contacted surfaces.

FIG. 5a to 5k present different embodiments of patterned second-electrodes of vertical semiconductor devices or chips in FIG. 2 and FIG. 3 of the present invention.

FIG. 5a shows a top view of a strip-ring-shaped second-electrode. The strip-ring-shaped electrode comprises wire bonding pad 501 at the center of one of strips 503 for wire bonding. Ring 502 surrounds strip 503. The spacing between two strips is predetermined so that the current is distributed uniformly without current crowding.

FIG. 5b shows a strip-ring-shaped second-electrode with two wire bonding pad 504 at diagonal corners. The dimension of a high power semiconductor device or chip is larger and more current flows through the chip. Plurality of wire bonding pads is needed.

FIG. 5c shows a grid-ring-shaped second-electrode with one horizontal strip 506 and one wire bonding pad 505 at the center of grid. Grid is surrounded by ring 507. FIG. 5d shows the grid-ring-shaped second-electrode of FIG. 5c with two of wire bonding pad 508.

FIG. 5e and FIG. 5f show other embodiments of grid-ring-shaped second-electrode with one and two wire bonding pad 509 and 512 respectively. Grid is surrounded by ring 511 and has plurality of horizontal strips 510.

FIG. 5g and FIG. 5h show grid-shaped second-electrode with one and two wire bonding pad 513 and 515 respectively, and having one horizontal strip 514. Horizontal strip 514 may also be at an end of vertical strips.

FIG. 5i and FIG. 5j show other embodiments of grid-shaped second-electrode with one and two wire bonding pad 516 and 518 respectively and having plurality of horizontal strips 517.

FIG. 5k shows a multi-ring-cross-shaped second-electrode. Multi-ring 520 surrounds cross 521. Wire bonding pad 519 is located at the center of cross 521. For high power chips, there are may be plurality of wire bonding pads.

The spacing between strips, grids, and rings is predetermined so that the current is distributed uniformly. For high power semiconductor devices or chips, the current density is high and multiple wire bonding pads may be needed. The dimensions of strips, grids, and rings are predetermined so that the strips, grids, and rings are robust enough to carry high density current and small enough not to block light more than necessary.

Note that, in FIG. 5a to 5k, each of patterned second-electrodes may be disposed either directly on the epitaxial layer or on a current spreading layer which is disposed on the epitaxial layer, and each of patterned second-electrodes may have either one or plurality of wire bonding pads. With patterned second-electrodes as shown in FIG. 5, current is more uniformly distributed and flows through whole area of active layer. Therefore the material of active layer is effectively utilized and the current density may be higher. The higher current density is proportional to higher light output power.

Although the description above contains many specifications, these should not be construed as limiting the scope of the present invention but as merely providing illustrations of some of the presently preferred embodiments of the present invention. Various modifications can be included in the present invention within a range which can be easily realized by those skilled in the art without departing from the spirit and principle of the scope of claims. Therefore the scope of the present invention should be determined by the claims and their legal equivalents, rather than by the examples given.

What is claimed is:

1. A method for manufacturing vertical semiconductor chips or devices, comprises process steps, in the order presented:

providing a substrate;

growing a first-type cladding layer on said substrate;

disposing a second intermediate layer on said first-type cladding layer;

disposing an electrically conductive supporting plate on said second intermediate layer to form a bonded wafer;

removing said substrate from said bonded wafer so that said first-type cladding layer exposed;

growing an epitaxial layer on said first-type cladding layer; wherein said epitaxial layer comprising an active layer which emits light and a second-type cladding layer;

disposing a patterned second-electrode on said second-type cladding layer, wherein said patterned second-electrode comprising at least one wire bonding pad.

2. The method for manufacturing vertical semiconductor chips or devices of claim 1, further comprises process steps: (1) disposing a first intermediate layer on said substrate and growing said first-type cladding layer on said first intermediate layer; and (2) removing said first intermediate layer after said process step of removing said substrate so that said first-type cladding layer exposed.

3. The method for manufacturing vertical semiconductor chips or devices of claim 2, wherein said first intermediate layer is selected from a group comprising: (1) a metal layer; (2) one or plurality of buffer layers selected from a group comprising AlN, GaN, InN, AlGaN, AlInN, and GaInN; and (3) their combinations.

4. The method for manufacturing vertical semiconductor chips or devices of claim 3, wherein said metal layer comprises: (1) a low melting point metal layer having melting point lower than the temperature of growing said epitaxial layer and being selected from a group comprising Cd, Sn, and In (indium); (2) a high melting point metal layer having melting point higher than the temperature of growing said epitaxial layer and being selected from a group comprising Au and Ti; and (3) their combinations.

5. The method for manufacturing vertical semiconductor chips or devices of claim 3, wherein a method of removing said substrate is selected from a group comprising: (1) etching; (2) precisely lapping/polishing; (3) heating up said bonded wafer until said metal layer dissolved and separating said substrate from said bonded wafer; and (4) their combinations;

wherein a method of removing said first intermediate layer being selected from a group comprising: (1) precisely lapping/polishing; (2) etching; and (3) their combinations.

6. The method for manufacturing vertical semiconductor chips or devices of claim 1, further comprises a process step of disposing a reflector/Ohmic layer on said first-type cladding layer before said process step of disposing said second intermediate layer.

7. The method for manufacturing vertical semiconductor chips or devices of claim 1, further comprises a process step of texturing the top surface of said first-type cladding layer after said process step of growing a first-type cladding layer.

8. The method for manufacturing vertical semiconductor chips or devices of claim 7, further comprises a process step of disposing a reflector/Ohmic layer on said textured top surface of said first-type cladding layer before said process step of disposing said second intermediate layer.

9. The method for manufacturing vertical semiconductor chips or devices of claim 1, wherein a method for disposing said electrically conductive supporting plate is selected from a group comprising: (1) wafer bonding; (2) electroplating or electro-less plating; (3) vacuum evaporation (electron beam and sputter); and (4) their combinations.

10. The method for manufacturing vertical semiconductor chips or devices of claim 1, further comprises a process step of growing a first-type cladding thin film on said first-type cladding layer before said process step of growing said epitaxial layer on said first-type cladding layer for improving crystal quality of said epitaxial layer.

11. The method for manufacturing vertical semiconductor chips or devices of claim 1, further comprises a process step of disposing a current spreading layer between said second-type cladding layer and said patterned second-electrode.

* * * * *